(12) United States Patent
Su et al.

(10) Patent No.: US 7,576,356 B2
(45) Date of Patent: Aug. 18, 2009

(54) SOLUTION PROCESSED CROSSLINKABLE HOLE INJECTION AND HOLE TRANSPORT POLYMERS FOR OLEDS

(75) Inventors: Wencheng Su, Cupertino, CA (US); Franky So, San Jose, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 155 days.

(21) Appl. No.: 11/200,453

(22) Filed: Aug. 8, 2005

(65) Prior Publication Data
US 2007/0029556 A1    Feb. 8, 2007

(51) Int. Cl.
*H01L 23/58* (2006.01)
*H01L 29/10* (2006.01)

(52) U.S. Cl. .......... 257/48; 257/E51.008; 257/E51.018; 257/E51.032

(58) Field of Classification Search .......... 257/48, 257/E51.008, E51.018, E51.032
See application file for complete search history.

(56) References Cited

U.S. PATENT DOCUMENTS

| | | | | |
|---|---|---|---|---|
| 5,585,213 A | * | 12/1996 | Tamano et al. | 430/58.5 |
| 5,698,740 A | * | 12/1997 | Enokida et al. | 564/308 |
| 5,948,552 A | * | 9/1999 | Antoniadis et al. | 428/690 |
| 6,169,163 B1 | * | 1/2001 | Woo et al. | 528/397 |
| 6,849,348 B2 | * | 2/2005 | Zheng et al. | 428/690 |
| 2005/0158523 A1 | | 7/2005 | Gupta et al. | |
| 2006/0076557 A1 | * | 4/2006 | Waller et al. | 257/40 |

OTHER PUBLICATIONS

"Vernetzung", Römpp Chemie Lexikon (Encyclopedia of Chemistry), 1995 Edition, p. 4898.

* cited by examiner

*Primary Examiner*—Matthew Smith
(74) *Attorney, Agent, or Firm*—Fish & Richardson P.C.

(57) ABSTRACT

A fully solution-processed polymer electroluminescent device has a hole injection layer fabricated using a crosslinkable hole injection/transport material doped with conductivity dopants.

36 Claims, 4 Drawing Sheets

FIG. 4B though the typical device structure of a poly-
SOLUTION PROCESSED CROSSLINKABLE HOLE INJECTION AND HOLE TRANSPORT POLYMERS FOR OLEDS

BACKGROUND

An OLED device could be fabricated from small molecule or polymeric materials. A typical device structure of a polymer light-emitting diode (PLED) consists of an anode (e.g. indium-tin-oxide (ITO)), a hole injection layer (e.g. poly(3, 4-ethylenedioxythiopene):poly(styrene sulfonic acid) (PEDOT:PSS), or polyaniline), an electroluminescent layer, and a cathode layer (e.g. barium covered with aluminum). Among the two organic layers, the function of the hole injection layer is to provide efficient hole injection into subsequent adjacent layers. In addition, hole injection layer also acts as a buffer layer to smooth the surface of the anode and to provide a better adhesion for the subsequent layer. The function of the electroluminescent layer is to transport both types of carriers and to efficiently produce light of desirable wavelength from electron-hole pair (exciton) recombination. Solution-processed polymer light-emitting diodes (PLEDs) have demonstrated advantages such as ease of fabrication, low fabrication cost, and the possibility of producing large area displays. Hole injection layers used in typical PLEDs is usually a conductive polymer doped with polymeric acid in the form of aqueous particle suspension, e.g., PEDOT/PSS. Although this works for some applications, it still has some drawbacks: (1) The particle nature usually requires a relatively thicker layer to avoid pixel short and strong leakage current. (2) The polymeric acid dopant is usually the major component to achieve the required conductivity. This makes the formed layer non-homogeneous in bulk and surface composition. (3) The dopant acid group is suspected to be electrochemically unstable during device operation.

DETAILED DESCRIPTION

In various embodiments of the invention, a solution-processed PLED device (and method of making same) is disclosed which does not utilize a conventional conductive polymer hole injection layer. One or more embodiments utilizes one or more crosslinkable arylamine-type hole injection/transport polymers along with conductivity dopants. This eliminates the use of the acidic hole injection/transport layers such as PEDOT:PSS. Advantageously, both the uncrosslinked arylamine-type polymer and the conductivity dopant material are completely solution soluble. This eliminates the drawbacks associated with particle suspension. All the other layers in the PLED, such as light-emitting polymer layer, can also be solution-processed. Some features of the various embodiments of the invention are listed below.

(1) The use of crosslinkable materials ensures that the hole injection/transport layer will become insoluble to the solvent used to deposit subsequent adjacent layers (e.g., emissive layer) so as to avoid intermixing between adjacent layers. Alternatively, modifying the polarity of the materials can be used to adjust the solubility. The solution-processable hole injection/transport materials can be selected from arylamine-based polymers, aromatic amine-based small molecules, and copolymers or blends of different hole transport materials. In case of small molecules, they have to be blended with a polymer to obtain better film-forming property. The crosslinkable groups could be from either the small molecule, the polymer, or both.

(2) Conductivity dopants are used to increase the conductivity of the arylamine-type hole injection/transport materials. Such conductivity dopants can reduce the voltage drop along the hole injection/transport layer and improve device stability. Both inorganic and organic conductivity dopants can be used. Examples of inorganic dopants include ferric chloride ($FeCl_3$), ferric bromide ($FeBr_3$), antimony pentachloride ($SbCl_5$), arsenic pentachloride($AsCl_5$), boron trifluoride ($BF_3$), etc. The examples of organic dopants include 2,3,5,6-tetrafluoro-7,7,8,8-tetracyano-quinodimethane (F4-TCNQ), dicyanodichloroquinone, and trinitrofluorenone, etc. A common solvent for the dopant materials and the arylamine polymers will be used to obtain a homogeneous solution. The molar percentage of such a materials can be varied from 0.001% to 60% in the final films, preferably from 1-10%.

(3) Such a hole injection/transport layer should have proper energy alignment with both the anode (ITO) and the lighting emitting polymer layer. Two separate crosslinkable layers also can be used, for example, where the first layer is responsible for hole injection and the second layer is responsible for hole transport. One or both layers can contain conductivity dopants.

In at least one embodiment of the invention, disclosed is an electroluminescent (EL) device with a bi-layer organic stack comprising a hole injection/transport layer (HIL) which is composed of 1) a crosslinkable hole injection/transport polymer and 2) one or more conductivity dopants. The HIL can be rendered insoluble by the use of cross-linking so that it does not degrade by the solvent used to fabricate the emissive layer. The term "degrade" as used herein means significant physical and/or chemical change has occurred, e.g., dissolving, intermixing, delaminating, etc. In other embodiments of the invention, an electroluminescent device is disclosed with a tri-layer organic stack comprising a hole injection layer (HIL) which is composed of a crosslinkable hole injection material and at least one conductivity dopant and a hole transport interlayer which can optionally include conductivity dopants. In various embodiments of the invention, in both bi-layer and tri-layer devices, the HIL can be composed of a small molecule material such as an aromatic amine in a polymer binder along with a cross-linking side-group.

Figure 1:
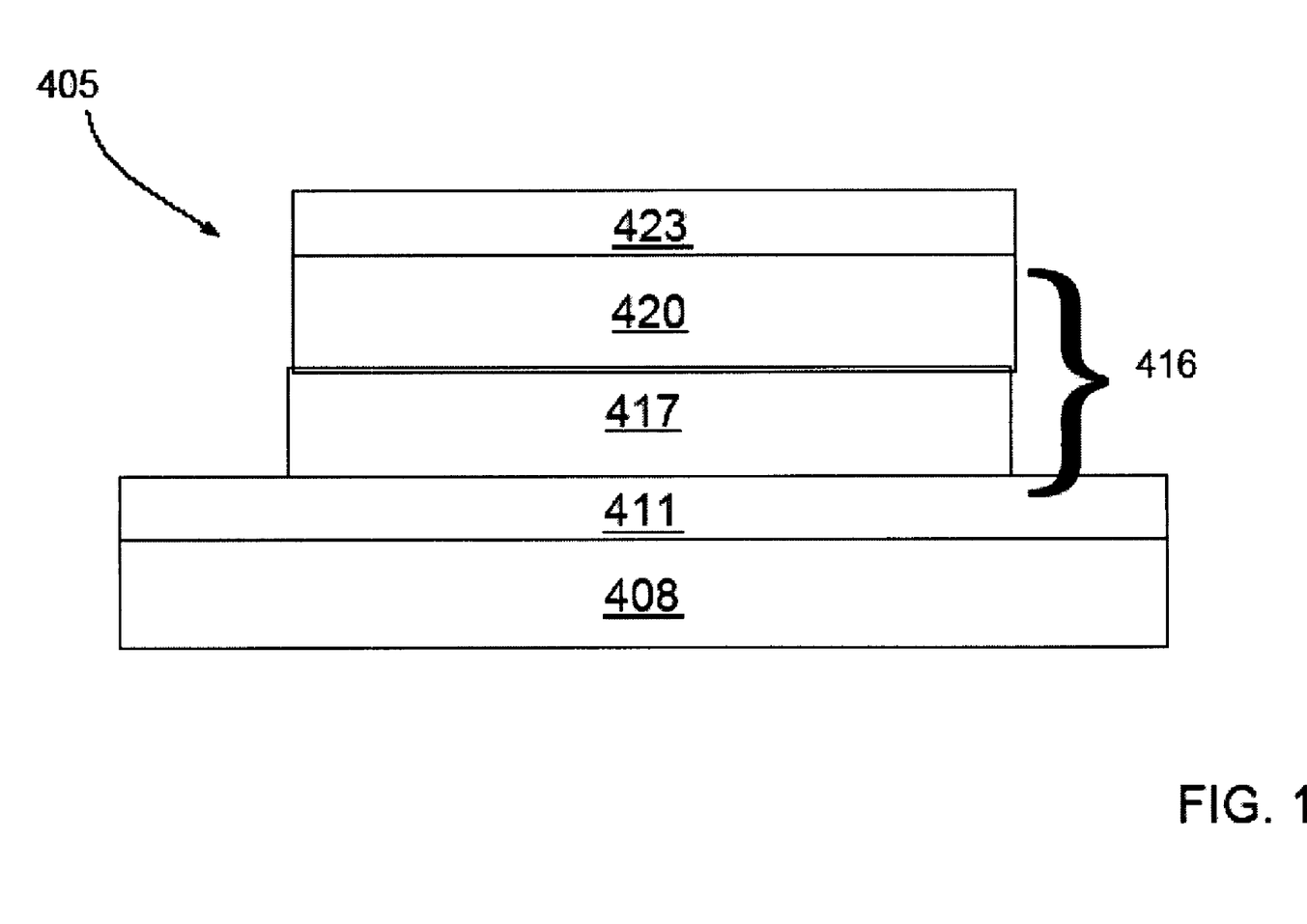
FIG. 1 shows a cross-sectional view of an embodiment of an electroluminescent (EL) device 405 according to at least one embodiment of the invention.

FIG. 1 shows a cross-sectional view of an embodiment of an electroluminescent (EL) device 405 according to at least one embodiment of the invention. The EL device 405 may represent one pixel or sub-pixel of a larger display or part of lighting source. As shown in FIG. 1, the EL device 405 includes a first electrode 411 on a substrate 408. As used within the specification and the claims, the term "on" includes when layers are in physical contact or when layers are separated by one or more intervening layers. The first electrode 411 may be patterned for pixilated applications or remain un-patterned for backlight applications.

One or more organic materials are deposited to form one or more organic layers of an organic stack 416. The organic stack 416 is on the first electrode 411. In at least one embodiment of the invention, the organic stack 416 includes a hole injection layer ("HIL") 417 and emissive layer (EML) 420. The OLED device 405 also includes a second electrode 423 on the organic stack 416. Other layers than that shown in FIG. 1 may also be added including barrier, charge transport/injection, and interface layers between or among any of the existing layers as desired. Some of these layers, in accordance with the invention, are described in greater detail below.

Substrate 408:

The substrate 408 can be any material that can support the organic and metallic layers on it. The substrate 408 can be transparent or opaque (e.g., the opaque substrate is used in top-emitting devices). By modifying or filtering the wavelength of light which can pass through the substrate 408, the color of light emitted by the device can be changed. The substrate 408 can be comprised of glass, quartz, silicon, plastic, or stainless steel; preferably, the substrate 408 is comprised of thin, flexible glass. The preferred thickness of the substrate 408 depends on the material used and on the application of the device. The substrate 408 can be in the form of a sheet or continuous film. The continuous film can be used, for example, for roll-to-roll manufacturing processes which are particularly suited for plastic, metal, and metallized plastic foils. The substrate can also have transistors or other switching elements built in to control the operation of an active-matrix OLED device. A single substrate 408 is typically used to construct a larger display containing many pixels (EL devices) such as EL device 405 repetitively fabricated and arranged in some specific pattern.

First Electrode 411:

In one configuration, the first electrode 411 functions as an anode (the anode is a conductive layer which serves as a hole-injecting layer and which comprises a material with work function typically greater than about 4.5 eV). Typical anode materials include metals (such as platinum, gold, palladium, and the like); metal oxides (such as lead oxide, tin oxide, ITO (Indium Tin Oxide), and the like); graphite; doped inorganic semiconductors (such as silicon, germanium, gallium arsenide, and the like); and doped conducting polymers (such as polyaniline, polypyrrole, polythiophene, and the like).

The first electrode 411 can be transparent, semi-transparent, or opaque to the wavelength of light generated within the device. The thickness of the first electrode 411 can be from about 10 nm to about 1000 nm, preferably, from about 50 nm to about 200 nm, and more preferably, is about 100 nm. The first electrode layer 411 can typically be fabricated using any of the techniques known in the art for deposition of thin films, including, for example, vacuum evaporation, sputtering, electron beam deposition, or chemical vapor deposition.

HIL 417:

The HIL 417 has good hole conducting properties and is used to effectively inject holes from the first electrode 411 to the EML 420. It also functions as a hole transporting layer. In accordance with some embodiments of the invention, the HIL 417 consists of a crosslinkable polymer doped with conductivity dopants. In accordance with other embodiments of the invention, the HIL 417 consists of a small molecule with a polymer binder which is doped with conductivity dopants and includes a cross-linking group.

An exemplary crosslinkable polymer is an aryl-amine type polymer with aryl-amine moiety in the main chain or side chain, e.g. Poly(N,N'-bis(4-butylphenyl)-N,N'-bis(phenyl)-benzidine), Poly((9,9-dihexylfluorenyl-2,7-diyl)-co-(N,N'-bis(4-butylphenyl-1,4-phenylenediamine)), poly(9,9-dioctylfluorene)-alt-N, N'-phenyl-1,4-phenylenediamine, poly (2,7-(9,9-di-n-octylfluorene)-(1,4-phenylene-((4-secbutylphenyl)imino)-1,4-phenylene), etc. In one or more embodiments, small molecule materials include aromatic amines, e.g. tris(N,N-diphenylamino)triphenylamine, tris(methylphenylphenylamino)triphenylamine, etc.

Conductivity dopants are used to increase the conductivity of the arylamine-type hole injection/transport materials. Such conductivity dopants can reduce the voltage drop along the hole injection/transport layer and improve device stability. Both inorganic and organic conductivity dopants can be used. In one or more embodiments, inorganic conductivity dopants comprise, for example, at least one of the following: ferric chloride ($FeCl_3$), ferric bromide ($FeBr_3$), antimony pentachloride ($SbCl_5$), arsenic pentachloride ($AsCl_5$), boron trifluoride ($BF_3$), etc. In one or more embodiments, organic conductivity dopants comprise, for example, at least one of the following: 2,3,5,6-tetrafluoro-7,7,8,8-tetracyano-quinodimethane (F4-TCNQ), dicyanodichloroquinone, and trinitrofluorenone, etc.

A solvent (e.g., chlorobenzene, dichlorobenzene), which can dissolve both the dopant materials and the arylamine polymers, will be used to obtain a homogeneous solution. The molar percentage of such a dopant materials can be varied from 0.001% to 60% in the final films, preferably from 1-10%.

The HIL 417 can have a final film thickness from about 5 nm to about 1000 nm, and is conventionally from about 50 nm to about 250 nm. The HIL 417 can be formed using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

In accordance with at least one embodiment of the invention, however, the preferred method of fabrication includes the following: One or more conductivity dopants are blended, mixed or matrixed with a crosslinkable hole injection/transport polymer material or a small molecule with a polymer binder. The materials are then deposited on the first electrode 411 (preferably by spin coating) and then allowed to dry into a film. The dried film is then cross-linked by thermal, chemical or other irradiative means (ultra-violet curing) and become insoluble to the solvents used in a layer deposited upon it (such as EML 420). The cross-linked film represents the HIL 417. In some embodiments, the crosslinking of the deposited composition can be initiated immediately after deposition such that drying and cross-linking occur contemporaneously. This may include the use of ultraviolet curable inks, crosslinkable side chains, crosslinkable chain end groups, monomers which can be cross-linked into polymers, cross-linking agents, initiators, polymer blends, polymer matrices and so on. The general process(es) of cross-linking organic materials is well-known, and will not be described further. As one possible alternative to cross-linking, the HIL 417 can be rendered insoluble by adjusting its polarity in accordance with the polarity of the solvent (e.g. toluene, xylene etc.) that is to be used in fabricating the EML 420.

EML 420:

For organic LEDs (OLEDs), the EML 420 contains at least one organic material that emits light. These organic light emitting materials generally fall into two categories: small-molecule light emitting materials and polymer light-emitting materials. In embodiments of the invention, devices utilizing polymeric active electronic materials in EML 420 are especially preferred (in PLEDs). The polymers may be organic or organo-metallic in nature. As used herein, the term organic also includes organo-metallic materials. Light-emission in these materials may be generated as a result of fluorescence or phosphorescence.

Preferably, these polymers are solvated in an organic solvent, such as toluene or xylene, and spun (spin-coated) onto the device, although other deposition methods are possible too.

The light emitting organic polymers in the EML 420 can be, for example, electroluminescent (EL) polymers having a conjugated repeating unit, in particular EL polymers in which neighboring repeating units are bonded in a conjugated manner, such as polythiophenes, polyphenylenes, polythiophenevinylenes, or poly-p-phenylenevinylenes or their families, copolymers, derivatives, or mixtures thereof. More specifically, organic polymers can be, for example: polyfluorenes; poly-p-phenylenevinylenes that emit white, red, blue, yellow, or green light and are 2-, or 2,5- substituted poly-p-phenylenevinylenes; polyspiro polymers.

In addition to polymers, smaller organic molecules that emit by fluorescence or by phosphorescence can serve as a light emitting material residing in EML 420. Combinations of PLED materials and smaller organic molecules can also serve as active electronic layer. For example, a PLED may be chemically derivatized with a small organic molecule or simply mixed with a small organic molecule to form EML 420. Examples of electroluminescent small molecule materials include tris(8-hydroxyquinolate) aluminum ($Alq_3$), anthracene, rubrene, tris(2-phenylpyridine) iridium (Ir(ppy)$_3$), triazine, any metal-chelate compounds and derivatives of any of these materials. Those materials will be applied by solutions methods.

In addition to materials that emit light, EML 420 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, triphenylamine, and triphenyldiamine. EML 420 may also include semiconductors, such as silicon, gallium arsenide, cadmium selenide, or cadmium sulfide.

All of the organic layers such as HIL 417 and EML 420 can be ink-jet printed by depositing an organic solution or by spin-coating, or other solution-based deposition techniques. This organic solution may be any "fluid" or deformable mass capable of flowing under pressure and may include solutions, inks, pastes, emulsions, dispersions and so on. The liquid may also contain or be supplemented by further substances which affect the viscosity, contact angle, thickening, affinity, drying, dilution and so on of the deposited drops.

Further, EML 420 may also be cross-linked or otherwise physically or chemically hardened as desired for stability and maintenance of certain surface properties desirable for deposition of subsequent layers.

Second Electrode (423)

In one embodiment, second electrode 423 functions as a cathode when an electric potential is applied across the first electrode 411 and the second electrode 423. In this embodiment, when an electric potential is applied across the first electrode 411, which serves as the anode, and second electrode 423, which serves as the cathode, photons are released from EML 420 and pass through first electrode 411 and substrate 408.

While many materials, which can function as a cathode, are known to those of skill in the art, most preferably a composition that includes aluminum, indium, silver, gold, magnesium, calcium, lithium fluoride, cesium fluoride, sodium fluoride, and barium, or combinations thereof, or alloys thereof, is utilized. Aluminum, aluminum alloys, and combinations of magnesium and silver or their alloys can also be utilized. In some embodiments of the invention, a second electrode 423 is fabricated by thermally evaporating in a two layer or combined fashion barium and aluminum in various amounts.

Preferably, the total thickness of second electrode 423 is from about 3 to about 1000 nanometers (nm), more preferably from about 50 to about 500 nm, and most preferably from about 100 to about 300 nm. While many methods are known to those of ordinary skill in the art by which the second electrode material may be deposited, vacuum deposition methods, such as physical vapor deposition (PVD) are desirable.

Often other steps such as washing and neutralization of films, addition of masks and photo-resists may precede cathode deposition. However, these are not specifically enumerated as they do not relate specifically to the novel aspects of the invention. Other steps (not described) like adding metal lines to connect the anode lines to power sources may also be desirable. Other layers (not shown) such as a barrier layer and/or getter layer and/or other encapsulation scheme may also be used to protect the electronic device. Such other processing steps and layers are well-known in the art and are not specifically discussed herein.

Figure 2:
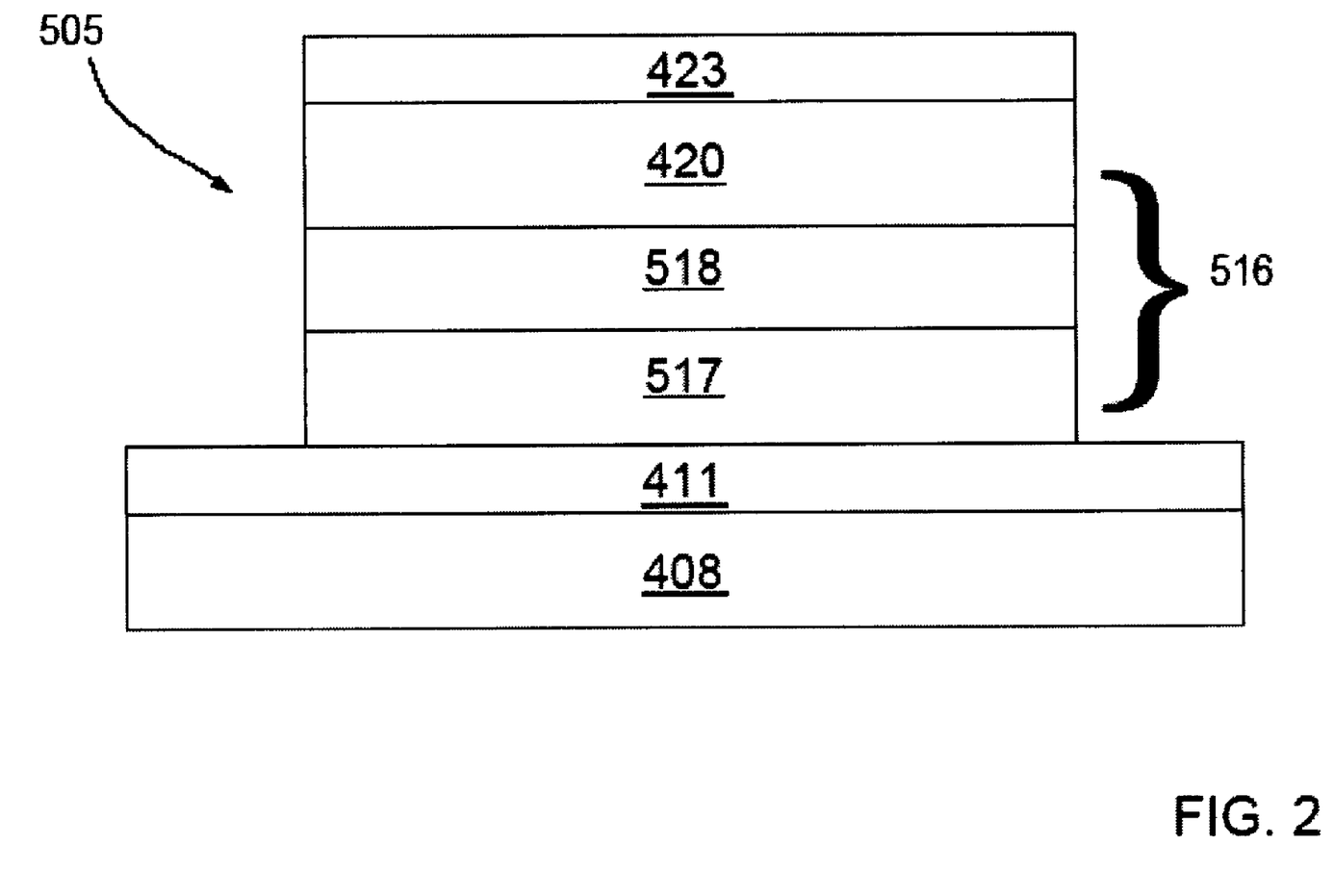
FIG. 2 shows a cross-sectional view of an embodiment of an electroluminescent (EL) device 505 according to at least one embodiment of the invention.

FIG. 2 shows a cross-sectional view of an embodiment of an electroluminescent (EL) device 505 according to at least one embodiment of the invention. Device 505 is similar or identical to device 405 in all aspects with like-numbered elements having the same or similar descriptions, except for the following. Organic stack 516 comprises at least three layers EML 420, a hole transporting (HT) interlayer 518 and a hole injection layer (HIL) 517. Unlike HIL 417 which combines hole transport and hole injection functionalities, organic stack 516 divides these functions into separate layers 517 and 518.

HIL 517:

The HIL 517 has good hole conducting properties and is used to effectively inject holes from the first electrode 411 to the EML 420 via hole transport (HT) interlayer 518. It also functions as a hole transporting layer. In accordance with some embodiments of the invention, the HIL 417 consists of a crosslinkable polymer which may be doped with conductivity dopants. In accordance with other embodiments of the invention, the HIL 417 consists of a small molecule with a polymer binder which may be doped with conductivity dopants and includes a cross-linking group.

An exemplary crosslinkable polymer is an aryl-amine type polymer with aryl-amine moiety in the main chain or side chain, e.g. Poly(N,N'-bis(4-butylphenyl)-N,N'-bis(phenyl)-benzidine), Poly((9,9-dihexylfluorenyl-2,7-diyl)-co-(N,N'-bis(4- butylphenyl-1,4-phenylenediamine)),poly(9,9-dioctylfluorene)-alt-N, N'-phenyl-1,4-phenylenediamine, poly (2,7-(9,9-di-n-octylfluorene)-(1,4-phenylene-((4-secbutylphenyl)imino)-1,4-phenylene), etc. In one or more embodiments, small molecule materials include aromatic amines, e.g., tris(N,N-diphenylamino)triphenylamine, tris (methylphenylphenylamino)triphenylamine, etc.

In accordance with at least one embodiment of the invention, HIL 517 includes one or more organic and/or inorganic conductivity dopants. In one or more embodiments, inorganic conductivity dopants comprise, for example, at least one of the following: ferric chloride ($FeCl_3$), ferric bromide ($FeBr_3$), antimony pentachloride ($SbCl_5$), arsenic pentachloride ($AsCl_5$), boron trifluoride ($BF_3$), etc. In one or more embodiments, organic conductivity dopants comprise, for example, at least one of the following: 2,3,5,6-tetrafluoro-7,7,8,8-tetracyano-quinodimethane (F4-TCNQ), dicyanodichloroquinone, and trinitrofluorenone, etc.

The HIL 517 is preferably cross-linked or otherwise physically or chemically rendered insoluble to prevent degradation of the HIL 517 when exposed to the solvent used in fabrication of subsequent adjacent layers such as the HT interlayer 518. Cross-linking can be achieved by exposing the film or deposited solution of HIL 517 to light, ultraviolet radiation, heat, or by chemical process. This may include the use of ultraviolet curable inks, crosslinkable side chains, crosslinkable chain end groups, monomers which can be cross-linked into polymers, cross-linking agents, initiators, polymer blends, polymer matrices and so on. The general process(es) of cross-linking organic materials is well-known, and will not be described further. As one possible alternative to cross-linking, the HIL 517 can be rendered insoluble by adjusting its polarity in accordance with the polarity of the solvent (e.g. toluene, xylene etc.) that is to be used in fabricating the HT interlayer 518. The HIL 517 can be fabricated prior to or in conjunction with the cross-linking process by ink-jet printing, by spin-coating or other proper deposition techniques.

HT Interlayer 518:

The functions of the HT interlayer 518 are among the following: to assist injection of holes into the EML 420, reduce exciton quenching, provide better hole transport than electron transport, and block electrons from getting into the HIL 517 and degrading it. Some materials may have one or two of the desired properties listed, but the effectiveness of the material as an interlayer is believed to improve with the number of these properties exhibited. The HT interlayer 518 may consist at least partially of or may derive from one or more following compounds, their derivatives, moieties, etc: polyfluorene derivatives, poly(2,7-(9,9-di-n-octylfluorene)-(1,4-phenylene-((4-secbutylphenyl)imino)-1,4-phenylene) and derivatives which include cross-linkable forms, non-emitting forms of poly(p-phenylenevinylene), triarylamine type material (e.g. triphenyldiamine (TPD), α-napthylphenyl-biphenyl (NPB)) mixed with a crosslinkable small molecule or polymer matrix, thiopene, oxetane-functionalized polymers and small molecules etc. The hole transporting materials used in the HT interlayer 518 are preferably polymer hole transporting materials, but can be small molecule hole transporting materials with a polymer binder. For example, polymers containing aromatic amine groups in the main chain or side chains are widely used as hole transporting materials. Preferably, the thickness for the HT interlayer 518 is 10-150 nm. More preferably the thickness for the HT interlayer 518 is 20-60 nm. In some embodiments of the invention, the HT interlayer 518 is fabricated using a cross-linkable hole transporting polymer.

In accordance with at least one embodiment of the invention, HT interlayer 518 may also include one ore more organic and/or inorganic conductivity dopants. In one or more embodiments, inorganic conductivity dopants comprise, for example, at least one of the following: ferric chloride ($FeCl_3$), ferric bromide ($FeBr_3$), antimony pentachloride ($SbCl_5$), arsenic pentachloride($AsCl_5$), boron trifluoride ($BF_3$), etc. In one or more embodiments, organic conductivity dopants comprise, for example, at least one of the following: 2,3,5,6-tetrafluoro-7,7,8,8-tetracyano-quinodimethane (F4-TCNQ), dicyanodichloroquinone, and trinitrofluorenone, etc.

The HT interlayer 518 is preferably cross-linked or otherwise physically or chemically rendered insoluble to prevent degradation of the HT interlayer 518 when exposed to the solvent used in fabrication of subsequent adjacent layers such as the EML 420. Cross-linking can be achieved by exposing the film or deposited solution of HT interlayer 518 to light, ultraviolet radiation, heat, or by chemical process. This may include the use of ultraviolet curable inks, crosslinkable side chains, crosslinkable chain end groups, monomers which can be cross-linked into polymers, cross-linking agents, initiators, polymer blends, polymer matrices and so on. The general process(es) of cross-linking organic materials is well-known, and will not be described further. As one possible alternative to cross-linking, the HT interlayer 518 can be rendered insoluble by adjusting its polarity in accordance with the polarity of the solvent (e.g. toluene, xylene etc.) that is to be used in fabricating the EML 420. The HT interlayer 518 can be fabricated prior to or in conjunction with the cross-linking process by ink-jet printing, by spin-coating or other proper deposition techniques.

In accordance with at least one embodiment of the invention, the preferred method of fabrication of device 505 includes the following: One or more conductivity dopants are blended, mixed or matrixed with a crosslinkable hole injection polymer material or a small molecule with a polymer binder. The materials are then deposited on the first electrode 411 (preferably by spin coating) and then allowed to dry into a film. The dried film is then cross-linked by thermal, chemical or other irradiative means (ultra-violet curing) and become insoluble to the solvents used in a layer deposited upon it (such as HT interlayer 518). The cross-linked film represents the HIL 517. In some embodiments, the crosslinking of the deposited composition can be initiated immediately after deposition such that drying and cross-linking occur contemporaneously. For HT interlayer 518, as an option, one ore more conductivity dopants are blended, mixed or matrixed with a crosslinkable hole transporting polymer material or a small molecule with a polymer binder. These materials are then deposited on the HIL 517 (preferably by spin coating) and then allowed to dry into a film. The dried film is then cross-linked by thermal, chemical or other irradiative means (ultra-violet curing) and become insoluble to the solvents used in a layer deposited upon it (such as EML 420). The cross-linked film represents the HT interlayer 518. In some embodiments, the crosslinking of the deposited materials can be initiated immediately after deposition such that drying and cross-linking occur contemporaneously.

Energy Alignment

For Bi-layer organic stack devices such as device 405 of FIG. 1, the hole injection/transport material used in HIL 417 is selected to have a better or close energy match with the first electrode 411 (the anode). This alignment allows holes to be transported more easily from the first electrode 411 to the EML 420. For a tri-layer organic stack device such as device 505 of FIG. 2, the hole injection material used in HIL 517 is selected to have a better or close energy match with the first electrode 411 (the anode). This alignment allows holes to be injected more easily from the first electrode 411 to the HT interlayer 518. The hole transporting material used in HT interlayer 518 is selected to have to a better or close energy match with the EML 420 so that holes that are injected can be more easily transported to (accepted by) EML 420.

Figure 3A:
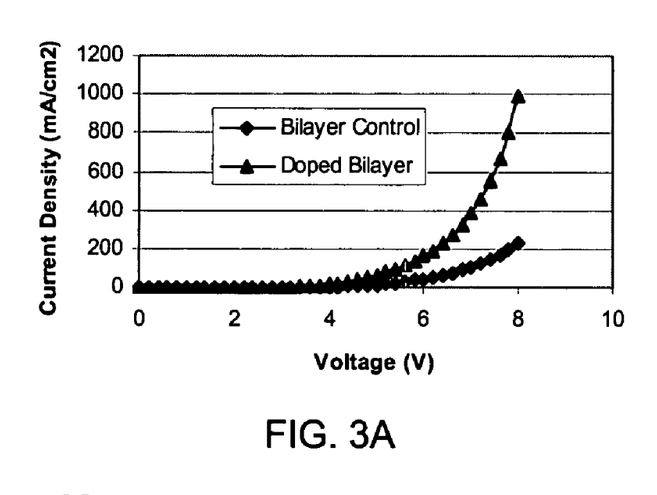
FIG. 3A illustrates current density versus voltage for bi-layer devices with and without conductivity dopants.

FIG. 3A illustrates current density versus voltage for bi-layer devices with and without conductivity dopants. A first device, labeled "Bilayer Control" has the following essential structure: Anode: ITO (Indium Tin Oxide)/HIL: 45 nm of an aryl-amine crosslinkable polyfluorene/EML: 75 nm orange polyfluorene-type LEP and Cathode: 6 nm barium and 200 nm aluminum. A second device labeled "Doped Bilayer" has the following essential structure: Anode: ITO (Indium Tin Oxide)/HIL: 45 nm of an aryl-amine crosslinkable polyfluorene doped with 4% molar $F_4$-TCNQ/EML: 75 nm orange polyfluorene-type LEP and Cathode: 6 nm barium and 200 nm aluminum. In each device the HIL was crosslinked to render it insoluble to the solvent used in fabricating the EML. In the Doped Bilayer device, current density is increased in all cases and dramatically so at over 4 volts. This indicates improved hole injection and transport resulting in greater current flow.

Figure 3B:
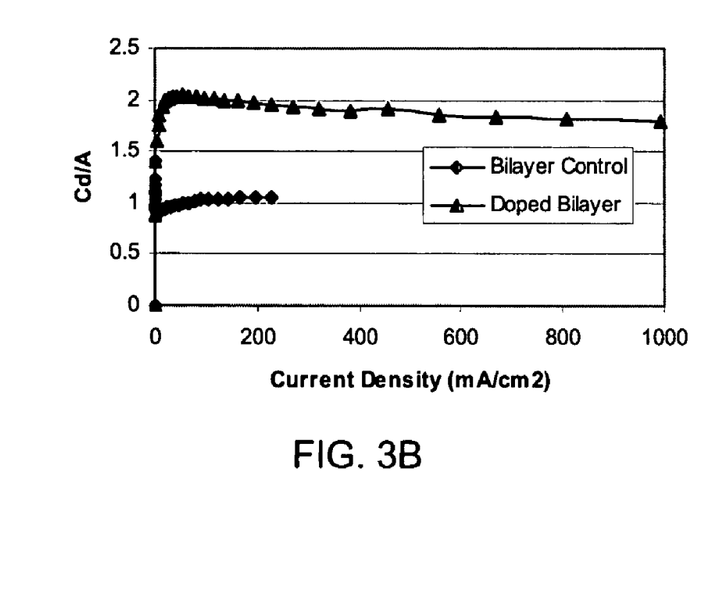
FIG. 3B illustrates luminous efficiency for bi-layer devices with and without conductivity dopants.

FIG. 3B illustrates luminous efficiency for bi-layer devices with and without conductivity dopants. The same two devices, Doped Bilayer and Bilayer Control, described above with respect to FIG. 3A were tested for luminous or photopic efficiency. The Bilayer Control device had a maximum of 200 MA/cm$^2$ current (at 8 volts, see FIG. 3A) while the Doped Bilayer had current flow up to around 1000 mA/cm$^2$ at the same voltage. The Doped Bilayer device shows a luminous efficiency roughly twice or 100% greater that of the Bilayer Control device. Luminous efficiency was measured in units of Cd/A.

Figure 3C:
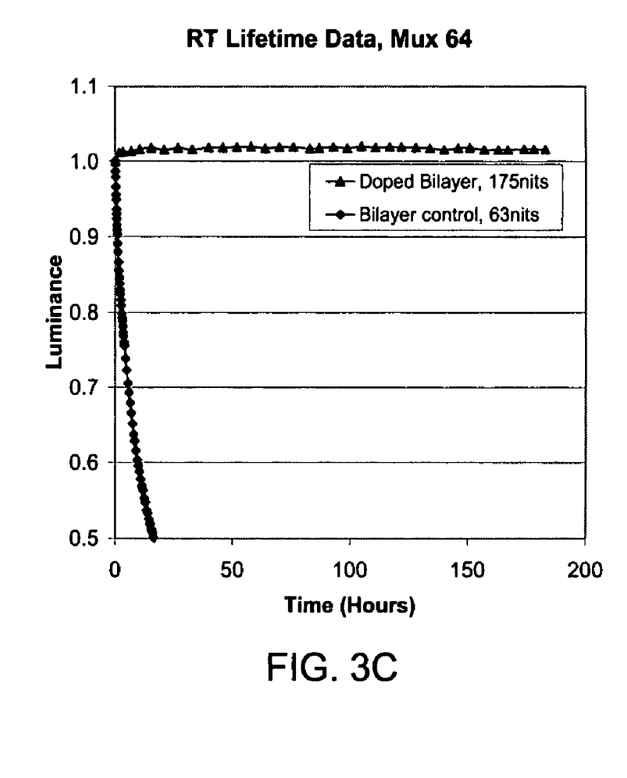
FIG. 3C illustrates lifetime data for bi-layer devices with and without conductivity dopants.

FIG. 3C illustrates lifetime data for bi-layer devices with and without conductivity dopants. The same two devices, Doped Bilayer and Bilayer Control, described above with respect to FIG. 3A were tested for lifetime. The lifetime testing was performed at room temperature under a multiplexed driving scheme with a duty cycle of 1/64 (mux 64). As shown, with the Doped Bilayer device there is little if any drop in normalized luminance over the first 200 hours. By contrast, with the Bilayer Control device, there is a large initial luminance drop within the first 20 or so hours of operation. This shows better lifetime and markedly better operational stability over time in the Doped Bilayer device.

Figure 4:
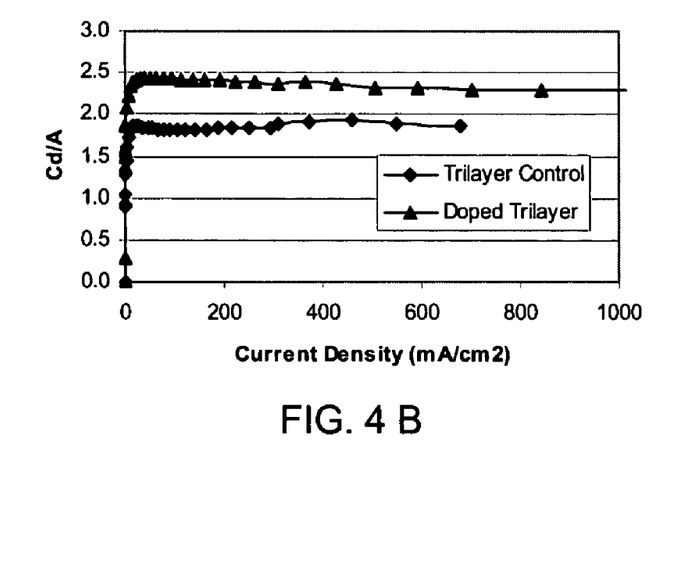
FIG. 4A illustrates current density versus voltage for tri-layer devices with and without conductivity dopants.
FIG. 4B illustrates luminous efficiency for tri-layer devices with and without conductivity dopants.
FIG. 4C illustrates lifetime data for tri-layer devices with and without conductivity dopants.
Figure 4A:
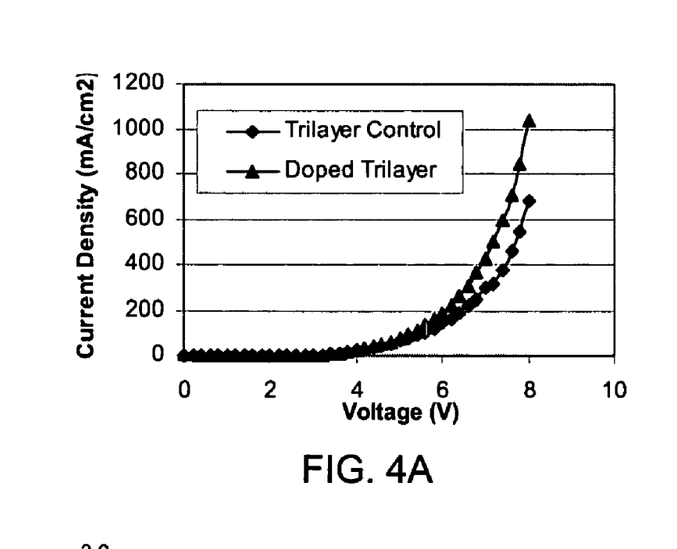

FIG. 4A illustrates current density versus voltage for tri-layer devices with and without conductivity dopants. A first device, labeled "Trilayer Control" has the following essential structure: Anode: ITO (Indium Tin Oxide)/HIL: 45 nm of an aryl-amine crosslinkable polyfluorene/HT interlayer: 30 nm hole transporting polymer/EML: 75 nm orange LEP and Cathode: 6 nm barium and 200 nm aluminum. A second device labeled "Doped Trilayer" has the following essential structure: Anode: ITO (Indium Tin Oxide)/HIL: 45 nm of an aryl-amine crosslinkable polyfluorene doped with 4% molar $F_4$-TCNQ/HT interlayer: 30 nm hole transporting polymer/ EML: 75 nm orange polyfluorene-type LEP and Cathode: 6 nm barium and 200 nm aluminum. In each device both the HIL and the HT interlayer was crosslinked to render it insoluble. In the Doped Trilayer device, current density is increased in all cases and dramatically so at over 4 volts. This indicates improved hole injection and transport resulting in greater current flow.

FIG. 4B illustrates luminous efficiency for tri-layer devices with and without conductivity dopants. The same two devices, Doped Trilayer and Trilayer Control, described above with respect to FIG. 4A were tested for luminous or photopic efficiency. The Trilayer Control device had a maximum of about 700 mA/cm$^2$ current (at 8 volts, see FIG. 4A) while the Doped Trilayer had current flow up to around 1000 mA/cm$^2$ at the same voltage. The Doped Trilayer device shows a luminous efficiency much greater that of the Trilayer Control device at all current densities. Luminous efficiency was measured in units of Cd/A.

Figure 4C:
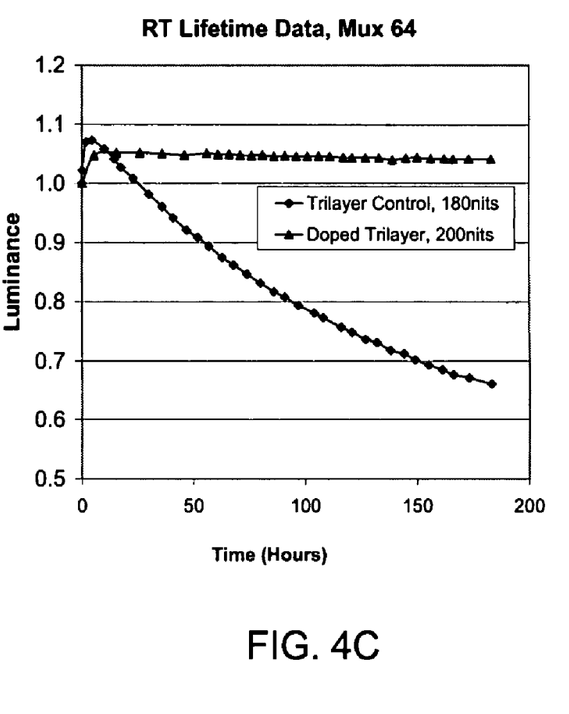

FIG. 4C illustrates lifetime data for tri-layer devices with and without conductivity dopants. The same two devices, Doped Trilayer and Trilayer Control, described above with respect to FIG. 4A were tested for lifetime. The lifetime testing was performed at room temperature under a multiplexed driving scheme with a duty cycle of 1/64 (mux 64). As shown, with the Doped Trilayer device there is little if any drop in normalized luminance over the first 200 hours. This shows better lifetime and markedly better operational stability over time in the Doped Trilayer device when compared to the Trilayer Control device.

As any person of ordinary skill in the art of electronic device fabrication will recognize from the description, figures, and examples that modifications and changes can be made to the embodiments of the invention without departing from the scope of the invention defined by the following claims.

The invention claimed is:

1. An electroluminescent device having a plurality of layers, comprising:
    an anode layer; and
    a crosslinked hole injection layer disposed over said anode layer, said hole injection layer doped with at least one conductivity dopant, wherein said at least one conductivity dopant is selected from ferric bromide ($FeBr_3$), antimony pentachloride ($SbCl_5$), arsenic pentachloride ($AsCl_5$), boron trifluoride ($BF_3$), 2,3,5,6-tetrafluoro-7,7, 8,8-tetracyano-quinodimethane ($F_4$-TCNQ), dicyanodichloroquinone and trinitrofluorenone.

2. The device of claim 1 further comprising an emissive layer disposed over said hole injection layer, said emissive layer capable of emitting light.

3. The device of claim 2 further comprising a cathode layer disposed above said emissive layer.

4. The device of claim 2 wherein said hole injection layer is provided a polarity to render the hole injection layer insoluble to solvent used in fabricating the emissive layer.

5. The device of claim 1 wherein the crosslinked hole injection layer is formed from a crosslinkable hole injection material that includes an aryl-amine type polymer.

6. The device of claim 1 wherein the crosslinked hole injection layer is formed from a crosslinkable hole injection material that is a polyfluorene based polymer.

7. The device of claim 1 wherein the crosslinked hole injection layer is formed from a crosslinkable hole injection material that is a small molecule material with a polymer binder.

8. The device of claim 1 wherein the crosslinked hole injection layer is insoluble to solvent used in fabricating a subsequent adjacent layer.

9. The device of claim 1 wherein said hole injection layer has a close energy alignment with said anode.

10. The device of claim 1, further comprising a hole transporting interlayer disposed over said hole injection layer, said hole transporting interlayer comprising a crosslinked hole transporting material.

11. The device of claim 10 further comprising an emissive layer disposed over said hole transporting interlayer through solution-based processing techniques, said emissive layer capable of emitting light.

12. The device of claim 11 further comprising a cathode layer disposed above said emissive layer.

13. The device of claim 10 wherein said hole injection material includes an aryl-amine type polymer.

14. The device of claim 10 wherein said hole injection material is a polyfluorene based polymer.

15. The device of claim 1 wherein said crosslinkable hole injection material comprises a small molecule with a polymer binder.

16. The device of claim 10 wherein said hole transporting interlayer is doped with at least one interlayer conductivity dopant.

17. The device of claim 16 wherein said at least one interlayer conductivity dopant is selected from ferric chloride ($FeCl_3$), ferric bromide ($FeBr_3$), antimony pentachloride ($SbCl_5$), arsenic pentachloride ($AsCl_5$), boron trifluoride ($BF_3$), 2,3,5,6-tetrafluoro-7,7,8,8-tetracyano-quinodimethane ($F_4$-TCNQ), dicyanodichloroquinone, and trinitrofluorenone.

18. The device of claim 10 wherein said hole injection layer is cross-linked to render the hole injection layer insoluble to solvent used in fabricating said hole transporting interlayer.

19. The device of claim 10 wherein said hole injection layer is provided a polarity to render the hole injection layer insoluble to solvent used in fabricating said hole transporting interlayer.

20. The device of claim 10 wherein said hole transporting interlayer is cross-linked to render the hole transporting interlayer insoluble to solvent used in fabricating a subsequent adjacent layer.

21. The device of claim 10 wherein said hole transporting interlayer is provided a polarity to render the hole transporting interlayer insoluble to solvent used in fabricating a subsequent adjacent layer.

22. The device of claim 10 wherein said hole injection layer has a close energy alignment with said anode layer.

23. The device of claim 10 further comprising an emissive layer disposed over said hole injection layer, wherein said emissive layer is capable of emitting light and said hole transporting interlayer has a close energy alignment with said emissive layer.

24. An electroluminescent device having a plurality of layers, comprising:
    an anode layer; and
    a crosslinked hole injection layer disposed over said anode layer, said hole injection layer doped with at least one conductivity dopant, wherein said at least one conductivity dopant is selected from ferric chloride ($FeCl_3$), ferric bromide ($FeBr_3$), antimony pentachloride ($SbCl_5$), arsenic pentachloride ($AsCl_5$), boron trifluoride ($BF_3$), 2,3,5,6-tetrafluoro-7,7,8,8-tetracyano-quinodimethane ($F_4$-TCNQ), dicyanodichloroquinone and trinitrofluorenone and the crosslinked hole injection layer is formed from non-acidic polymer.

25. The device of claim 24 further comprising an emissive layer disposed over said hole injection layer, said emissive layer capable of emitting light.

26. The device of claim 25 further comprising a cathode layer disposed above said emissive layer.

27. The device of claim 25 wherein said hole injection layer is provided a polarity to render the hole injection layer insoluble to solvent used in fabricating the emissive layer.

28. The device of claim 24 wherein the crosslinked hole injection layer is formed from a crosslinkable hole injection material that includes an aryl-amine type polymer.

29. The device of claim 24 wherein the crosslinked hole injection layer is formed from a crosslinkable hole injection material that is a polyfluorene based polymer.

30. The device of claim 24 wherein said crosslinked hole injection layer is formed from a crosslinkable hole injection material that is a small molecule material that is a small molecule material with a polymer binder.

31. The device of claim 24 wherein the crosslinked hole injection layer is insoluble to solvent used in fabricating a subsequent adjacent layer.

32. The device of claim 24 wherein said hole injection layer has a close energy alignment with said anode.

33. A method for fabricating an organic electroluminescent device, comprising:
    fabricating an anode layer;
    blending hole injection/transport materials with at least one conductivity dopant, wherein the at least one conductivity dopant is selected from ferric bromide ($FeBr_3$), antimony pentachloride ($SbCl_5$), arsenic pentachloride ($AsCl_5$), boron trifluoride ($BF_3$), 2,3,5,6-tetrafluoro-7,7,8,8-tetracyano-quinodimethane ($F_4$-TCNQ), dicyanodichloroquinone and trinitrofluorenone to form a blend;
    fabricating over said anode layer a hole injection layer from said blend;
    fabricating an emissive layer over said hole injection layer; and
    prior to fabricating said emissive layer, crosslinking said hole injection layer to render the hole injection layer insoluble to solvent used in fabricating the emissive layer.

34. The method of claim 33, further comprising:
    prior to fabricating the emissive layer, fabricating over said hole injection layer a hole transporting interlayer from a hole transporting material; and
    prior to fabricating said emissive layer, crosslinking said hole injection layer and rendering said hole transporting interlayer insoluble.

35. The method of claim 34 wherein rendering insoluble is achieved by one of cross-linking or modifying the polarity of said layers.

36. The method of claim 34 wherein said hole transporting interlayer further comprises at least one transporting interlayer conductivity dopant.

* * * * *

UNITED STATES PATENT AND TRADEMARK OFFICE
CERTIFICATE OF CORRECTION

PATENT NO. : 7,576,356 B2
APPLICATION NO. : 11/200453
DATED : August 18, 2009
INVENTOR(S) : Wencheng Su et al.

It is certified that error appears in the above-identified patent and that said Letters Patent is hereby corrected as shown below:

Column 11, Line 1 at Claim 15; replace:
 "The device of claim 1 wherein said crosslinkable hole" with
 -- The device of claim 10 wherein said crosslinkable hole --

Column 11, Line 9 at Claim 17; replace:
 "($FeCl_3$), ferric bromide ($FeBr_3$), antimony pentachioride" with
 -- ($FeCl_3$), ferric bromide ($FeBr_3$), antimony pentachloride --

Column 12, Lines 14-15 at Claim 30; replace:
 "material that is a small molecule material that is a small molecule material with a polymer binder" with
 -- material that is a small molecule material with a polymer binder --

Column 12, Line 34 at Claim 33; replace:
 "and" with
 -- and, --

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,576,356 B2 | Page 1 of 1 |
| APPLICATION NO. | : 11/200453 | |
| DATED | : August 18, 2009 | |
| INVENTOR(S) | : Su et al. | |

It is certified that error appears in the above-identified patent and that said Letters Patent is hereby corrected as shown below:

Title Page, Item [*]

Delete the phrase "by 155 days" and insert -- by 75 days --.

Signed and Sealed this

Twenty-fourth Day of August, 2010

David J. Kappos
*Director of the United States Patent and Trademark Office*